United States Patent [19]
Brandt et al.

[11] Patent Number: 5,382,835
[45] Date of Patent: Jan. 17, 1995

[54] INTEGRATED MARX GENERATOR

[75] Inventors: Everett G. Brandt, Peoria, Ill.;
George Codina, North Hollywood, Calif.; Thomas J. Richards, Peoria, Ill.

[73] Assignee: Caterpillar Inc., Peoria, Ill.

[21] Appl. No.: 152,641

[22] Filed: Nov. 16, 1993

[51] Int. Cl.⁶ .............................. H02M 3/18
[52] U.S. Cl. ................... 307/106; 307/110; 363/59; 250/551; 376/105
[58] Field of Search ............... 361/298; 307/110, 106; 376/105; 250/550, 551; 363/59, 60; 204/298.28, 298.08

[56] References Cited
U.S. PATENT DOCUMENTS

| | | | |
|---|---|---|---|
| 4,365,337 | 12/1982 | Cirkel et al. | 372/87 |
| 4,900,947 | 2/1990 | Weiner et al. | 307/110 |
| 5,064,522 | 11/1991 | Wellerdieck | 204/298.28 |

Primary Examiner—A. D. Pellinen
Assistant Examiner—Aditya Krishnan
Attorney, Agent, or Firm—James R. Yee

[57] ABSTRACT

An integrated Marx generator circuit is constructed in one assembly from a housing with two oil-filled cavities. First and second capacitors each include two sets of spaced apart capacitor plates. The first and second capacitors are formed in the separate cavities. The space between the capacitor plates are filled with oil and insulating material. A set of four spark gap switches control the charging and discharging of the generator circuit.

15 Claims, 6 Drawing Sheets

INTEGRATED MARX GENERATOR

TECHNICAL FIELD

This invention relates generally to Marx-type generators and more particularly to a Marx-type generator integrated into a single package.

BACKGROUND ART

Marx generator circuits are widely used in high power applications in the scientific, industrial, and defense industries. Marx generators involve the charging of capacitors in parallel and the discharging of them in series. The objective of the generator circuit is to provide large output voltages and currents with fast rise times and minimum pulse jitter. For example, a Marx generator circuit may generate high voltage output pulses having a magnitude between 100 kV and 1 MV.

With reference to FIG. 1, a typical two stage Marx generator circuit 102 includes first and second capacitors 110,112. A first resistor 104 couples the circuit input to the first capacitor 110 and limits the charging current. Second and third resistors 106,108 couple the first and second capacitors 110,112 and isolate the capacitors 110,112 when the capacitors 110,112 are in series. A first switch 114 is used to alternatively connect the capacitors 110,112 in series and parallel. A second switch 116 couples the circuit to the output. To charge the circuit 102, the first and second switches 114,116 are open and the capacitors 110,112 are in parallel. To discharge the capacitors 110,112, the first switch 114 is closed placing the capacitors 110,112 in series. The second switch 116 is closed to deliver the output pulse. Typically, such circuits are composed of large individual components.

The typical Marx generator circuit described above has several physical and electrical constraints which limit its effectiveness in providing the desired large output voltages and currents and fast rise times.

First, the physical wiring coupling the separate components introduces power losses into the circuit. More importantly, the physical couplings add inductance to the circuit which acts towards slowing voltage and current rise times.

Second, the current limiting and isolating resistors 104,106,108 introduce power losses to the circuit.

Third as a result of the large voltages, the first and second capacitors (110,112) are typically large foil wound type capacitors. This type of capacitors has an inherent large inductance and limited current discharge capability due to the thinness of the conduction foils.

And fourth, also as result of the high operating voltages, the individual components tend to be quite large. In addition, because of the high voltage gradients, packaging results in large heavy assemblies.

The present invention is directed to overcoming one or more of the problems, as set forth above.

DISCLOSURE OF THE INVENTION

In one aspect of the present invention a capacitor is provided. The capacitor includes a housing with a center axis. The housing forms a cavity filled with oil. A center post is connected to the housing and extends along the center axis. The center post is composed of an electrically conductive material. The capacitor includes a plurality of inner capacitor plates. Each inner plate has an outer edge and is connected to the center post. The inner capacitor plates are axially aligned with the housing and are spaced apart and parallel and are electrically coupled through the center post. The capacitor further includes a plurality of outer capacitor plates. Each outer plate has an inner edge and an outer edge and is axially aligned with the housing. The outer capacitor plates are spaced apart and parallel. The inner edge defines an aperture centered about the center post. Each of the outer capacitor plates is disposed between consecutive inner capacitor plates. The outer capacitor plates are electrically coupled along the outer edge.

In another aspect of the present invention, an integrated Marx generator circuit is provided. The generator circuit is constructed in one assembly from a housing with two oil-filled cavities. First and second capacitors each include two spaced apart capacitor plates. The first and second capacitors are formed in the separate cavities. The spaces between the capacitor plates are filled with oil. A set of four spark gap switches control the charging and discharging of the generator circuit.

BEST MODE FOR CARRYING OUT THE INVENTION

Figure 1:
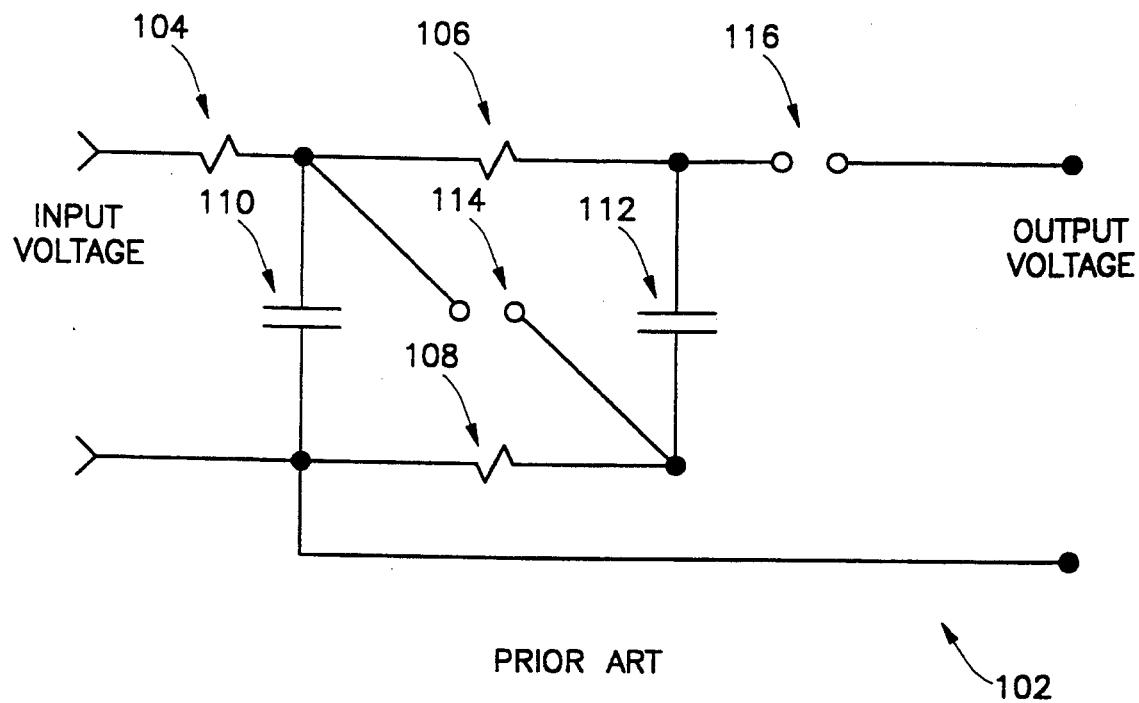
FIG. 1 is a schematic of a dual stage Marx generator of the prior art.
Figure 2:
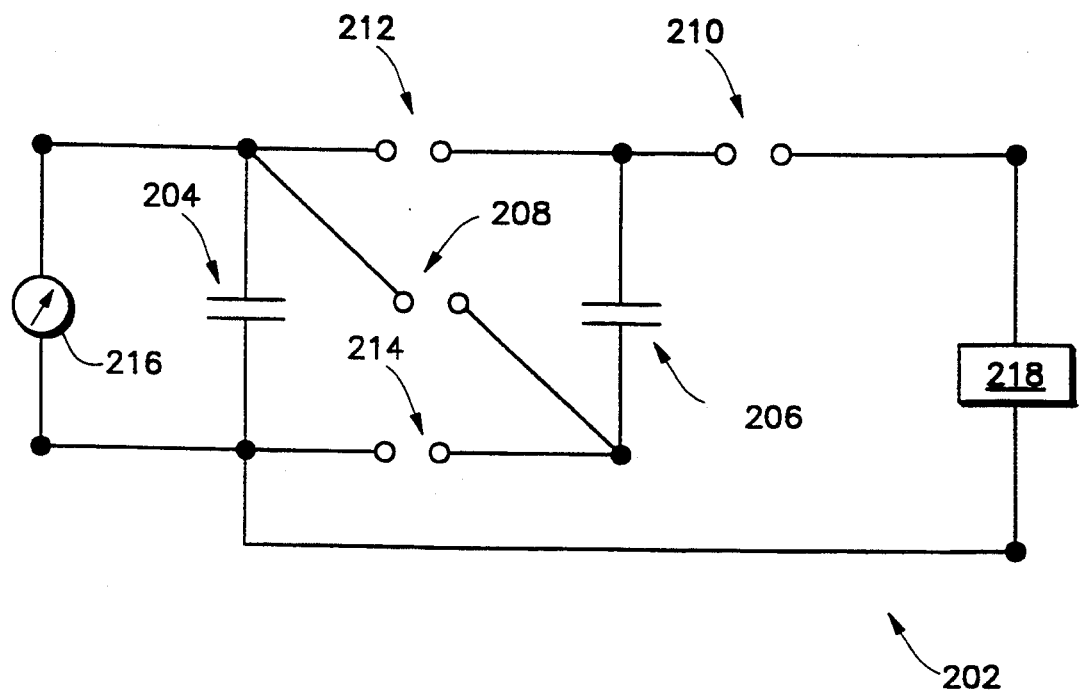
FIG. 2 is a schematic of a dual stage Marx generator, according to an embodiment of the present invention.

With reference to FIG. 2-9, the present invention provides an integrated Marx generator circuit 202 encapsulated in a single package. With particular reference to FIG. 2, the present invention replaces the current limiting and isolating resistors with additional switches. For the purposes of discussion and illustration, a dual stage Marx generator is illustrated. However, one skilled in the art would recognize the benefits of additional stages. The present invention is adaptable to providing multiple stage Marx generators.

The integrated circuit 202 includes first and second capacitors 204,206. The first and second capacitors 204,206 are charged when in parallel. A first switch 208 connects the first and second capacitors 204,206 such that when the first switch is closed the capacitors 204,206 are connected in series. A second switch 210 connects the circuit 202 to the output. Third and fourth switches 212,214 couple the capacitors 204,206 in parallel for charging. When the capacitors 204,206 are being charged, the first and second switches 208,210 are opened and the third and fourth switches 212,214 are closed. When the capacitors reach the charged voltage, the third and fourth switches 212,214 are opened and the first switch 208 is closed. For the capacitors 204,206 to discharge, the second switch 210 is closed, thereby connecting the circuit 202 to a load 218. A constant current source 216 charges the capacitors 204,206.

Figure 3:
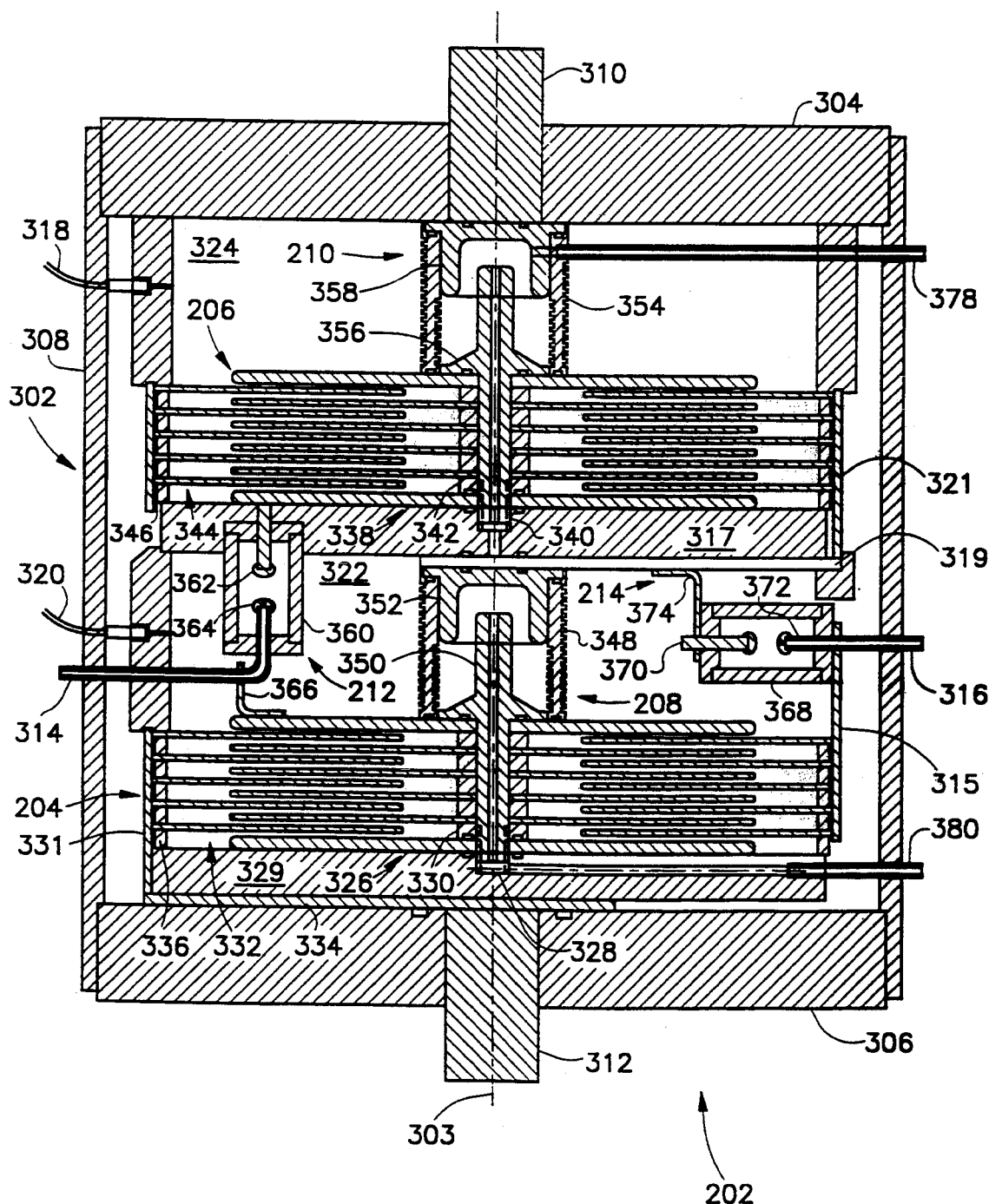
FIG. 3 is a diagrammatic representation of an integrated dual stage Marx generator having first and second capacitors and first, second, third, and fourth spark gap switches, according to an embodiment of the present invention.

With reference to FIG. 3, the circuit 202 of FIG. 2 is embodied in an integrated package. The integrated Marx generator 202 includes a housing 302 which forms first and second cavities 322,324. In the preferred embodiment, the first and second cavities are filled with oil. The oil provides insulation and heat-sinking characteristics. Additionally, the cavities are not physically sealed from one another, but are used to solely to define spatial relationships.

The integrated package is constructed of electrically conductive material and electrically insulating material. In FIG. 3, the electrically conductive material is cross-hatched downward from left to right and the electrically insulating material is cross-hatched upward from left to right.

Electrically conductive portions of the Marx generator 202 are preferably composed of copper or a copper alloy. One suitable alloy consisting of tungsten and copper is available under the trade name Elkonite. Preferably, the housing 302 and other insulating components are composed of acrylic or a polycarbonate. One such polycarbonate is available from General Electric under the name Lexan.

Positive and negative output connecters 310,312 are connected to the housing 302 and extend from outside the housing 302 to the interior of the housing 302. Positive and negative input connectors 314,316 are connected to the housing 302 and extend from outside the housing 302 to the interior of the housing 302.

The first and second capacitors 204,206 reside in the first and second cavities 322,324, respectively. Preferably, the first and second capacitors 204,206 are axially aligned with an axis 303.

For the purposes of discussion, the first capacitor will be discussed in detail. The second capacitor 206 is substantially identical to the first capacitor 204. The first capacitor 204 includes a center post 328 connected to an insulating plate 329. The center post 328 is composed of an electrically conductive material and extends along the center axis 303.

Figure 5:
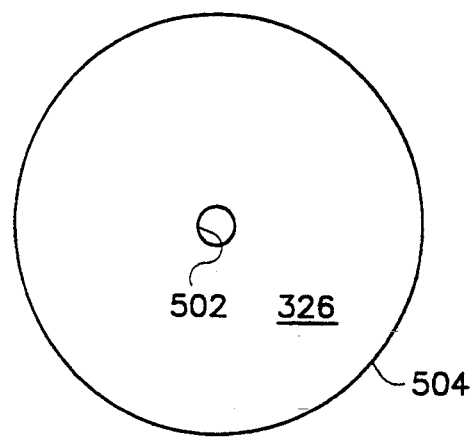
FIG. 5 is a diagrammatic representation of an inner capacitor plate of the capacitors of FIG. 3.

A plurality of inner capacitor plates 326 are connected to and axially aligned with the center post 328. A top view of an inner capacitor plate 326 is illustrated in FIG. 5. Each inner capacitor plate 326 has an inner edge 502 and an outer edge 504. The inner capacitor plates 326 are spaced apart and parallel and are electrically coupled to each other through the center post 328.

Figure 6:
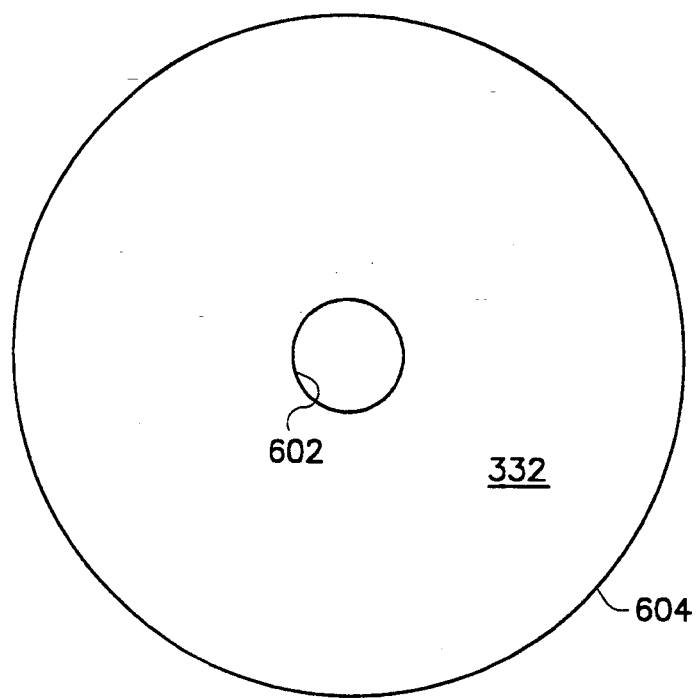
FIG. 6 is a diagrammatic representation of an outer capacitor plate of the capacitors of FIG. 3.

A plurality of outer capacitor plates 332 are connected to the housing 302 and are axially aligned with the center post 328. With reference to FIG. 6, the outer capacitor plates have an inner edge 602 and an outer edge 604. The outer capacitor plates 332 are spaced apart and parallel. The inner edge 602 of the outer capacitor plates 332 define an aperture centered about the center post 328.

The inner capacitor plates 326 of the first capacitor 204 are electrically coupled to the positive input connector 314. The outer capacitor plates 332 of the first capacitor 204 are electrically coupled to the negative input connector 316 and the negative output connecter 312.

An electrical connecter 334 electrically couples the outer capacitor plates 332 to each other along the outer edges 604.

Figure 4:
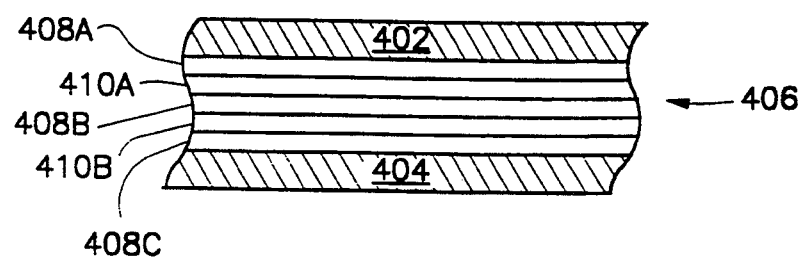
FIG. 4 is a diagrammatic representation of an enlarged portion of the capacitors of FIG. 3.
Figure 9:
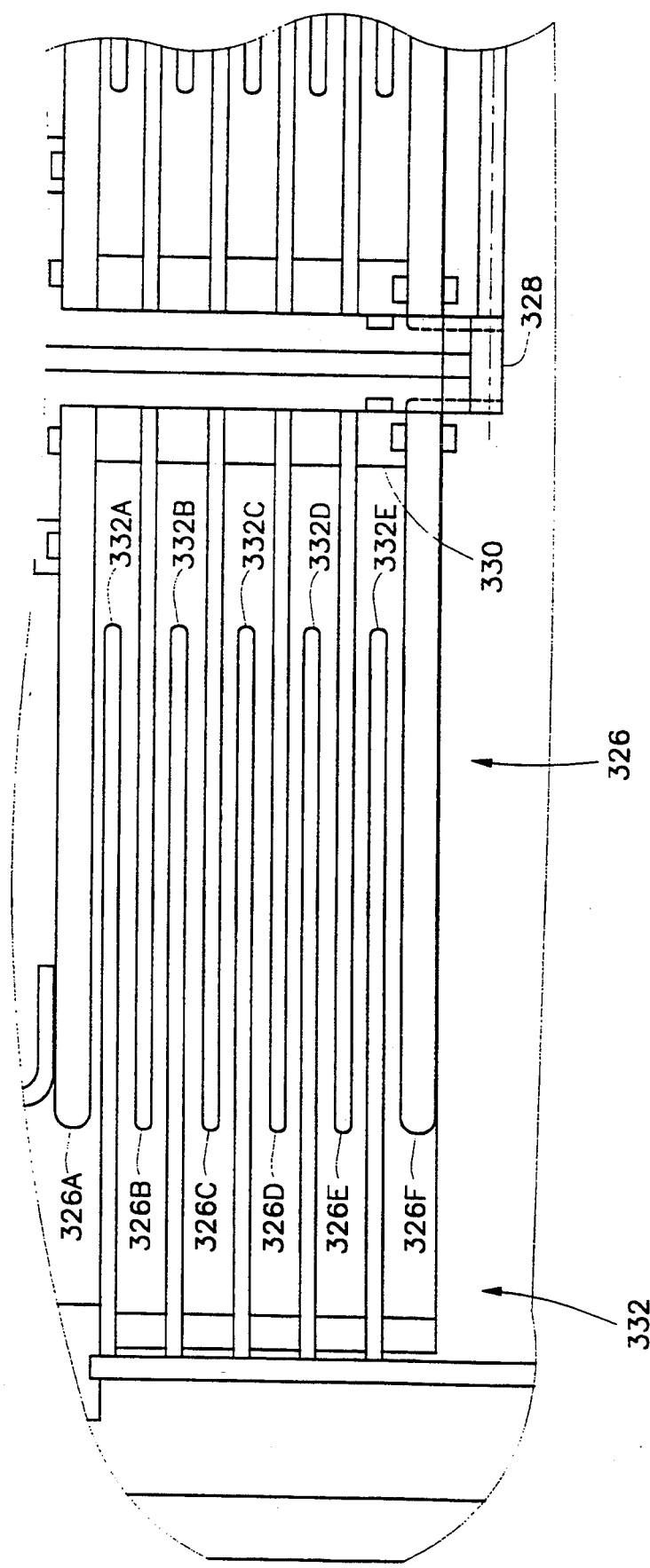
FIG. 9 is an enlarged portion of the capacitors of FIG. 3, illustrating inner and outer capacitor plates.

With reference to FIG. 9, in the preferred embodiment, the inner and outer capacitor plates 326A-F,332A-E are interleaved. With reference to FIG. 4, a layer of dielectric material 406 is disposed between consecutive capacitor plates 404. In the preferred embodiment, the layer of dielectric material 406 consists of alternate layers of first and second dielectric material. Preferably, the first dielectric material is an oil-impregnated insulation paper. A suitable electrical insulation paper is available from Windsor-Stevens, Inc. of Poquonock, Conn. Preferably, the second dielectric material consists of a polyester, polypropylene or polyethylene. A suitable polyester material and a suitable polyethylene are available from E.I. Dupont de Nemours Co. under the names Mylar and Hypalon, respectively. In the preferred embodiment, the first and second layers of dielectric material have different electrical breakdown characteristics.

Additionally, a third layer of material (not shown) may also be included. The third layer is preferably composed of Hypalon.

In the preferred embodiment, the first, second, third, and fourth switches 208,210,212,214 are composed of electrode assemblies which operate as spark gap switches. Each electrode assembly or spark gap switch 208,210,212,214 forms a gas filled cavity. Preferably, the switches 208,210,212,214 are filled with sulfur hexaflouride ($SF_6$). In the preferred embodiment, the switches 208,210,212,214 are actuated by controllably pressurizing and depressurizing the respective cavities. Sulfur hexaflouride ($SF_6$) electrically breaks down at low pressures and acts as an electrical conductor. At high pressure, sulfur hexaflouride acts as an electrical insulator.

The first switch 208 is connected to the housing 302 and is electrically connected to a conducting element 319. The first switch 208 includes first and second electrodes 350,352. A switch housing 348 forms the gas-filled cavity. The first electrode 350 is electrically coupled to the inner capacitor plates 326 of the first capacitor 204. The second electrode 352 is electrically coupled to the outer capacitor plates 344 of the second capacitor 206.

The second switch 210 is connected to the housing 302 and electrically connected to the positive output connector 310. The second switch 210 includes first and second electrodes 356,358. A switch housing 354 forms the gas filled cavity. The first electrode 356 is electrically coupled to the inner capacitor plates 338 of the second capacitor 206. The second electrode 358 is electrically coupled to the positive output connecter 310.

Figure 7:
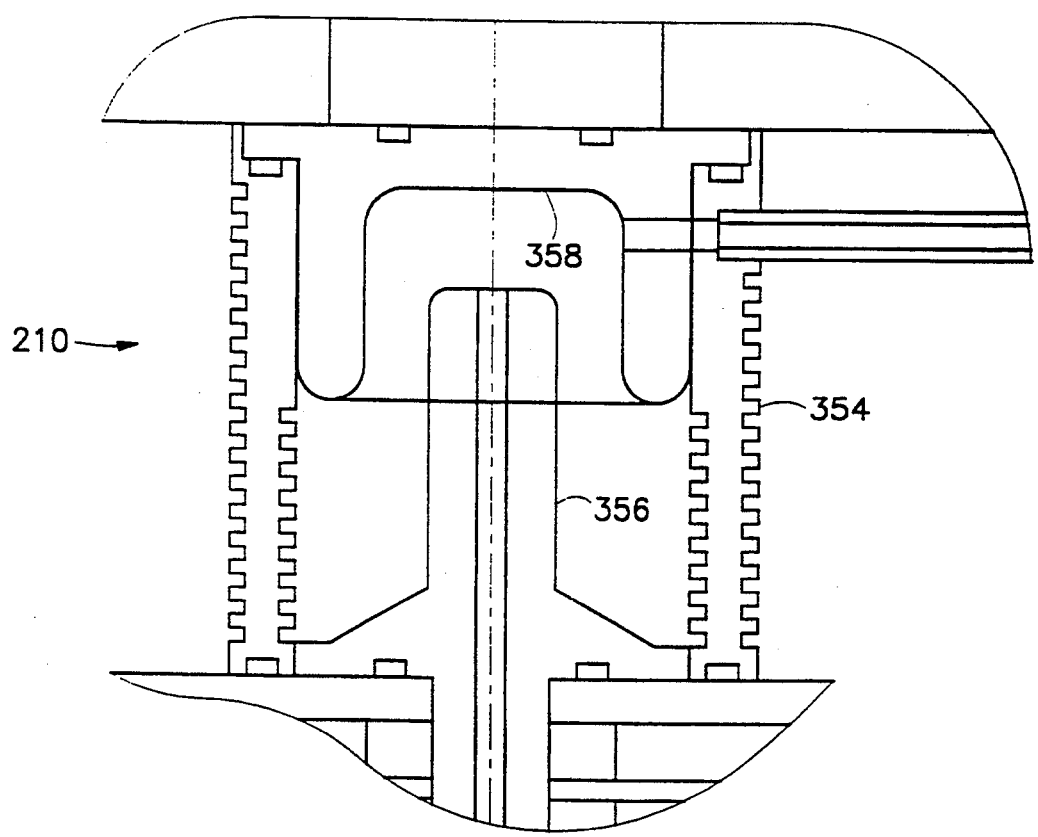
FIG. 7 is a diagrammatic representation of the second switch of FIG. 3.

As better illustrated in FIG. 7, the second electrode 352,358 of the first and second switches 208,210 form hollow tubes. The first electrodes 350,356 of the first and second switches 208,210 extend along the axis 303 into the hollow tubes formed by the respective second electrode 352,358. This arrangement lowers the inductance and electrical losses of the switch and increases the safety, reliance and life of the switch. Additionally, the first electrode 350,356 of the first and second switches 208,210 form a gas outlet port. In the preferred embodiment, the first and second switches 208,210 are pneumatically coupled. As, shown in FIG. 3, a hollow tube connected the two switches is formed by the first electrode 356 of the second switch 210, the center post 340 of the second capacitor 206, and the second electrode 352 of the first switch 208.

The third spark gap switch 212 is connected to an electrical insulator 317 and includes first and second electrodes 362,364. A switch housing 360 forms the gas filled cavity. The first electrode 362 is electrically coupled to the inner capacitor plates 338 of the second capacitor 206. The second electrode 364 is electrically coupled to the inner capacitor plates 326 of the first capacitor 204. Also, the second electrode 362 is electrically coupled to the positive input connector 314.

The fourth spark gap switch 214 is connected to a conducting element 315 and includes first and second electrodes 370,372. The first electrode 370 is electrically coupled to the outer capacitor plates 344 of the second capacitor 206. The second electrode 372 is electrically coupled to the outer capacitor plates 332 of the first capacitor 204 and to the negative input and output connectors 312,316.

Figure 8:
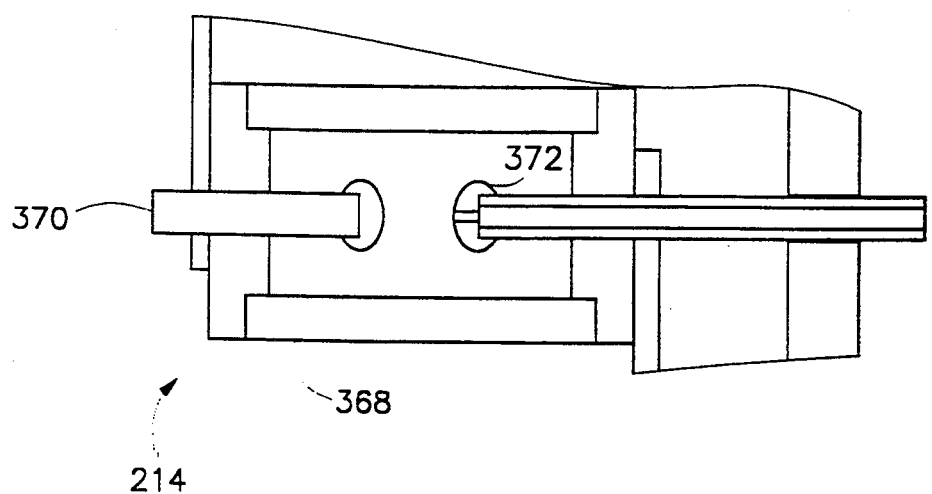
FIG. 8 is a diagrammatic representation of the fourth switch of FIG. 3.

In FIG. 8 an enlarged view of the fourth switch 214 is illustrated. The third switch 212 is substantially the same. As seen in FIGS. 3 and 8 in the preferred embodiment, the first and second electrodes 362,364,370,372 of the third and fourth switches 212,214 are spherical in shape. The second electrode 364,372 of each switch 212,214 forms a hollow tube which extends out of the housing 302 forming gas inlet/outlet ports 314,316.

First and second optical monitoring ports 318,320 allow visual monitoring of the operation of the switches via fiber optics.

A gas inlet port 378 extends from outside the housing 302 to cavity formed by the second switch 210. A gas outlet port 380 extends from outside the housing 302 to the cavity formed by the first switch 208.

Industrial Applicability

With reference to FIGS. 2-9, the present invention is adapted to provide a Marx generator, with less inductance, less electrical loss, and less pulse jitter, while providing fast electrical switch of high electrical currents. For the purposes of discussion, a dual stage Marx generator is illustrated. However, the present invention could be adapted to provide a Marx generator with more than two stages.

In the preferred embodiment, the first, second, third and fourth switches 208,210,212,214 are spark gap switches. Preferably, the switches are actuated by pressurizing and depressurizing the respective cavities with sulfur hexaflouride ($SF_6$). As illustrated in FIGS. 3 and 8, the second electrode 364,372 of the third and fourth switches 212,214 form gas inlet/outlet tubes 314,316. The gas inlet/outlet tubes are connected to a source of pressurized $SF_6$ (not shown) via a pair of valves (not shown). To open a switch, the valve is opened allowing the cavity to be pressurized by the source of $SF_6$. To close the switch, the cavity is vented.

As mentioned above, the first and second switches 208,210 are pneumatically coupled. A gas inlet port 378 couples the cavity formed by the second switch to a source of pressurized $SF_6$ via a valve (not shown). The close proximity of the first and second switches 208,210 also permits the rapid transfer of energy from one switch to the other via shock waves, ultraviolet radiation and a propagating high voltage pulse. When the first switch 208 turns on (electrically breaks down) it transfers energy to the second switch 210 to trigger it in rapid succession. A gas outlet port 380 allows the first and second switches to be vented via a valve (not shown). Since the switches are energetically coupled, they get turned on in a fast preferred ordered sequence.

In order to close the switches, the valve at the gas outlet port 380 is closed and the valve at the inlet port 378 is opened allowing both switches to be pressurized. To open the switches, the valve at the outlet port is opened, venting both cavities.

In order to charge the capacitors 204,206, the third and fourth switches 212,214 are closed by venting the pressurized gas and the first and second switched 208,210 are opened by pressurizing their respective cavities. After the capacitors 204,206 are charged, the third and fourth switches 212,214 are opened. To discharge the capacitors, the first and second switches 208,210 are closed to connect the first and second capacitors 214,216 in series to the load 218.

Other aspects, objects, and features of the present invention can be obtained from a study of the drawings, the disclosure, and the appended claims.

We claim:

1. A Marx generator integrated into a single package, comprising:
   a housing forming first and second cavities, said first and second cavities being filled with oil;
   a first capacitor having inner and outer capacitor plates and being connected to said housing, said inner and outer capacitor plates being spaced apart in said first cavity, the space between said inner and outer capacitor plates being filled with dielectric material;
   a first switch having first and second electrodes, said first electrode being electrically coupled to said inner capacitor plate of said first capacitor;
   a second capacitor having inner and outer capacitor plates and being connected to said housing, said inner and outer capacitor plates of said second capacitor being spaced apart in said second cavity, the space between said inner and outer plates being filled with said oil, wherein said second electrode of said first switch is electrically coupled to said outer capacitor plate of said second capacitor;
   a second switch having a first electrode, said first electrode being electrically coupled to said inner capacitor plate of said second capacitor;
   a third switch having first and second electrodes, said first electrode of said third switch being electrically coupled to said inner capacitor plate of said second capacitor, said second electrode of said third switch being electrically coupled to said inner capacitor plate of said first capacitor; and
   a fourth switch having first and second electrodes, said first electrode of said fourth switch being electrically coupled to said outer capacitor plate of said second capacitor, said second electrode of said fourth switch being electrically coupled to said outer capacitor plate of said first capacitor.

2. A Marx generator, as set forth in claim 1, wherein said first, second, third, and fourth switches are spark gap switches.

3. A Marx generator, as set forth in claim 2, wherein said first, second, third, and fourth switch form gas filled cavities.

4. A Marx generator, as set forth in claim 3, wherein said second switch is in said second cavity and said first, third, and fourth switches are in said first cavity.

5. A Marx generator, as set forth in claim 3, wherein said switches are filled with sulfur hexaflouride.

6. A Marx generator, as set forth in claim 5, wherein one of said electrodes of each switch form a gas inlet port.

7. A Marx generator, as set forth in claim 6, wherein said first and second capacitors are energetically coupled via said first switch with pulses of pressure, voltage, and ultraviolet radiation.

8. A Marx generator, as set forth in claim 1, wherein said first and second capacitors, each include:
- a center post extending along a center axis, said center post being composed of an electrically conductive material;
- a plurality of inner capacitor plates having an outer edge and being connected to said center post, said inner capacitor plates being axially aligned with said housing and spaced apart and parallel and being electrically coupled through said center post;
- a plurality of outer plates having an inner edge and an outer edge and being axially aligned with said housing, said outer plates being spaced apart and parallel, said inner edge defining an aperture, said aperture of each outer capacitor plates being centered about said center post;
- an electrical connecter connected along the outer edges of said outer capacitor plates for electrically connecting said outer capacitor plates;
- wherein each of said outer capacitor plates being disposed between consecutive inner capacitor plates; and including:
- dielectric material disposed between adjacent inner and outer capacitor plates.

9. A Marx generator, as set forth in claim 8, wherein said first and second capacitors include a dielectric material disposed between consecutive inner and outer capacitor plates.

10. A Marx generator, as set forth in claim 9, wherein said dielectric material consists of a first dielectric layer and a second dielectric material.

11. An integrated Marx generator, comprising:
- a housing forming first and second cavities, said first and second cavities being filled with oil;
- a positive output connecter being connected to said housing;
- a negative connector being connected to said housing;
- a positive input connecter being connected to said housing;
- a first capacitor having first and second ends, a plurality of inner capacitor plates and a plurality of outer capacitor plates and being connected to said housing within said first cavity, said first and second ends of said first capacitor being electrically coupled to said positive input connector and said negative connector, respectively, said plurality of inner capacitor plates being electrically coupled and said plurality of outer capacitor plates being electrically coupled;
- a second capacitor having a plurality of inner capacitor plates and a plurality of outer capacitor plates and being connected to said housing within said second cavity, said plurality of inner capacitor plates being electrically coupled and said plurality of outer capacitor plates being electrically coupled;
- a first spark gap switch connected to said housing, including:
  - a first electrode electrically coupled to said outer capacitor plates of said first capacitor; and
  - a second electrode electrically coupled to said inner capacitor plates of said second capacitor;
- a second spark gap switch connected to said housing, including a first electrode electrically coupled to said inner capacitor plates of said second capacitor;
- a third spark gap switch connected to said housing, including:
  - a first electrode electrically coupled to said inner capacitor plates of said second capacitor; and
  - a second electrode electrically coupled to said inner capacitor plates of said first capacitor; and
- a fourth spark gap switch connected to said housing, including:
  - a first electrode electrically coupled to said outer capacitor plates of said second capacitor; and
  - a second electrode electrically coupled to said outer capacitor plates of said first capacitor.

12. An integrated Marx generator, as set forth in claim 11, wherein said switches form cavities filled with sulfur hexaflouride.

13. An integrated Marx generator, as set forth in claim 12, wherein one of said electrodes of each switch form a gas inlet port.

14. An integrated Marx generator, as set forth in claim 13, wherein said switches are actuated by alternately pressuring and de-pressurizing respective cavities.

15. A Marx generator, as set forth in claim 14, wherein said first and second capacitors are energetically coupled.

* * * * *